US006839277B2

(12) United States Patent
Nguyen et al.

(10) Patent No.: US 6,839,277 B2
(45) Date of Patent: Jan. 4, 2005

(54) USER IDENTIFICATION FOR MULTI-PURPOSE FLASH MEMORY

(75) Inventors: Hung Q. Nguyen, Fremont, CA (US); Loc B. Hoang, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 14 days.

(21) Appl. No.: 10/246,196

(22) Filed: Sep. 17, 2002

(65) Prior Publication Data

US 2004/0052110 A1 Mar. 18, 2004

(51) Int. Cl.[7] .............................................. G11C 16/04
(52) U.S. Cl. ............................ 365/185.04; 365/189.04
(58) Field of Search .......................... 365/185.04, 51, 365/189.04, 189.09

(56) References Cited

U.S. PATENT DOCUMENTS 5,867,723 A * 2/1999 Chin et al. .................... 712/11

6,259,908 B1 * 7/2001 Austin ........................ 455/411

OTHER PUBLICATIONS

Silicon Storage Technology, Inc. Flash Memories and Mass Storage Products Data Book 2000, pp. 1.2–43 thru 1.2–68 and 7–27 thru 7–28.

* cited by examiner

Primary Examiner—Thong Q. Le
(74) Attorney, Agent, or Firm—Gray Cary Ware & Freidenrich LLP

(57) ABSTRACT

A memory system includes manufacturer identifiers, such as serial numbers and part numbers, stored in locations of memory that are unalterable by end users. A customer identification location of the memory allows the user to program its own identifier and includes a locking code that prevents subsequent alteration of the customer identification location. A recall procedure at power on verifies the content of the locked code for allowing alteration of the memory.

14 Claims, 4 Drawing Sheets

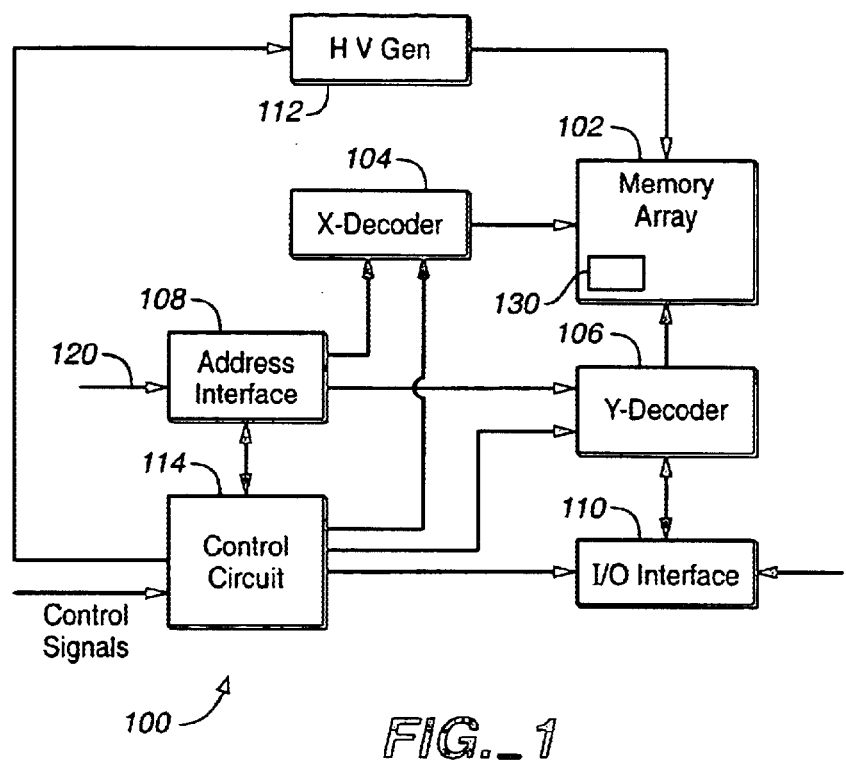
FIG._1
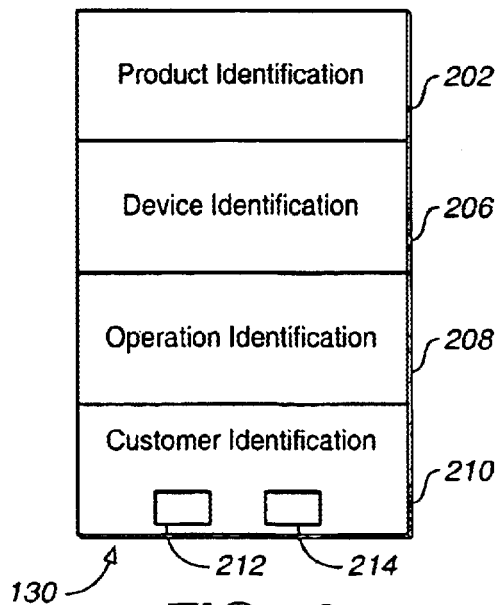
FIG._2

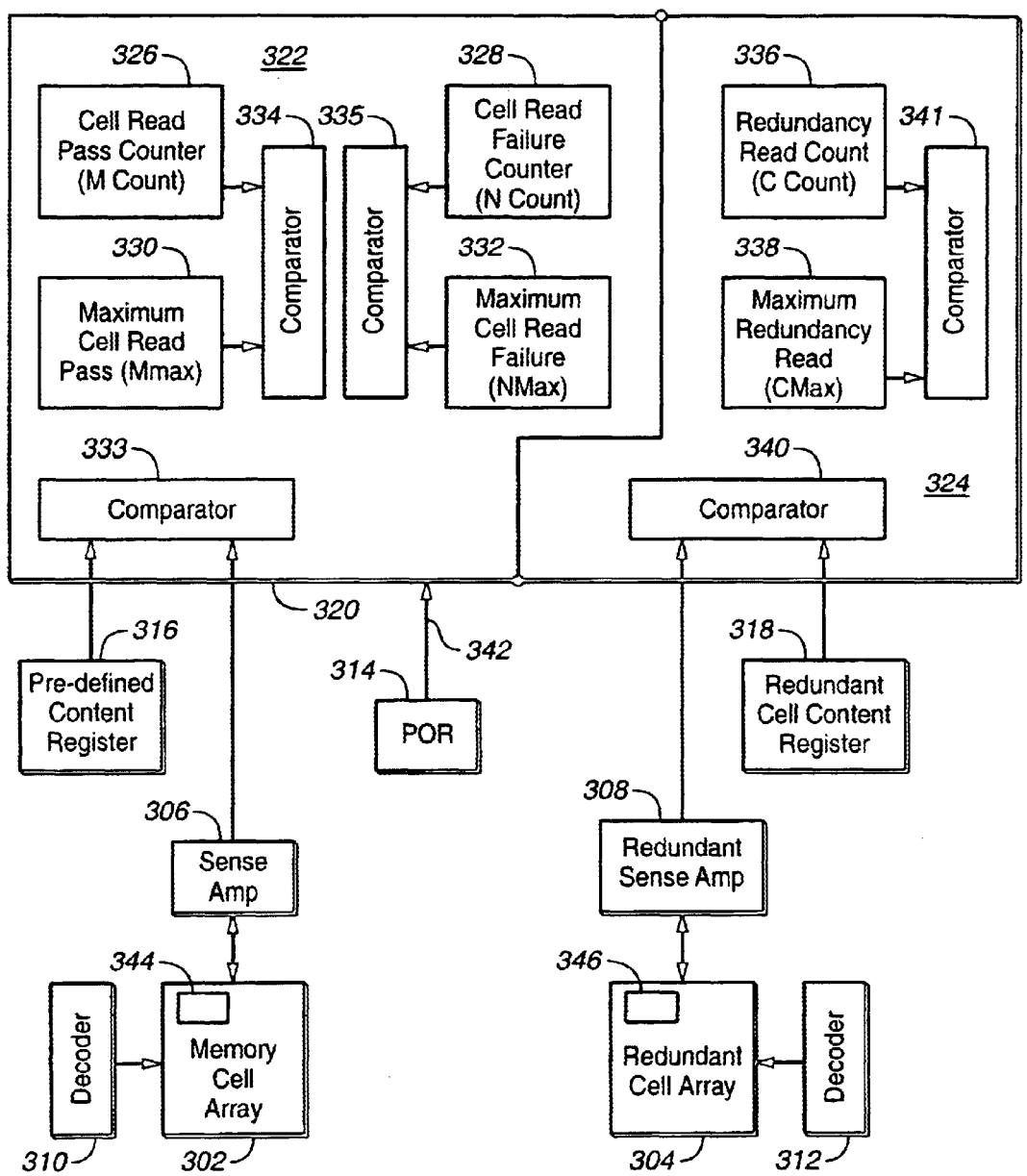
FIG._3

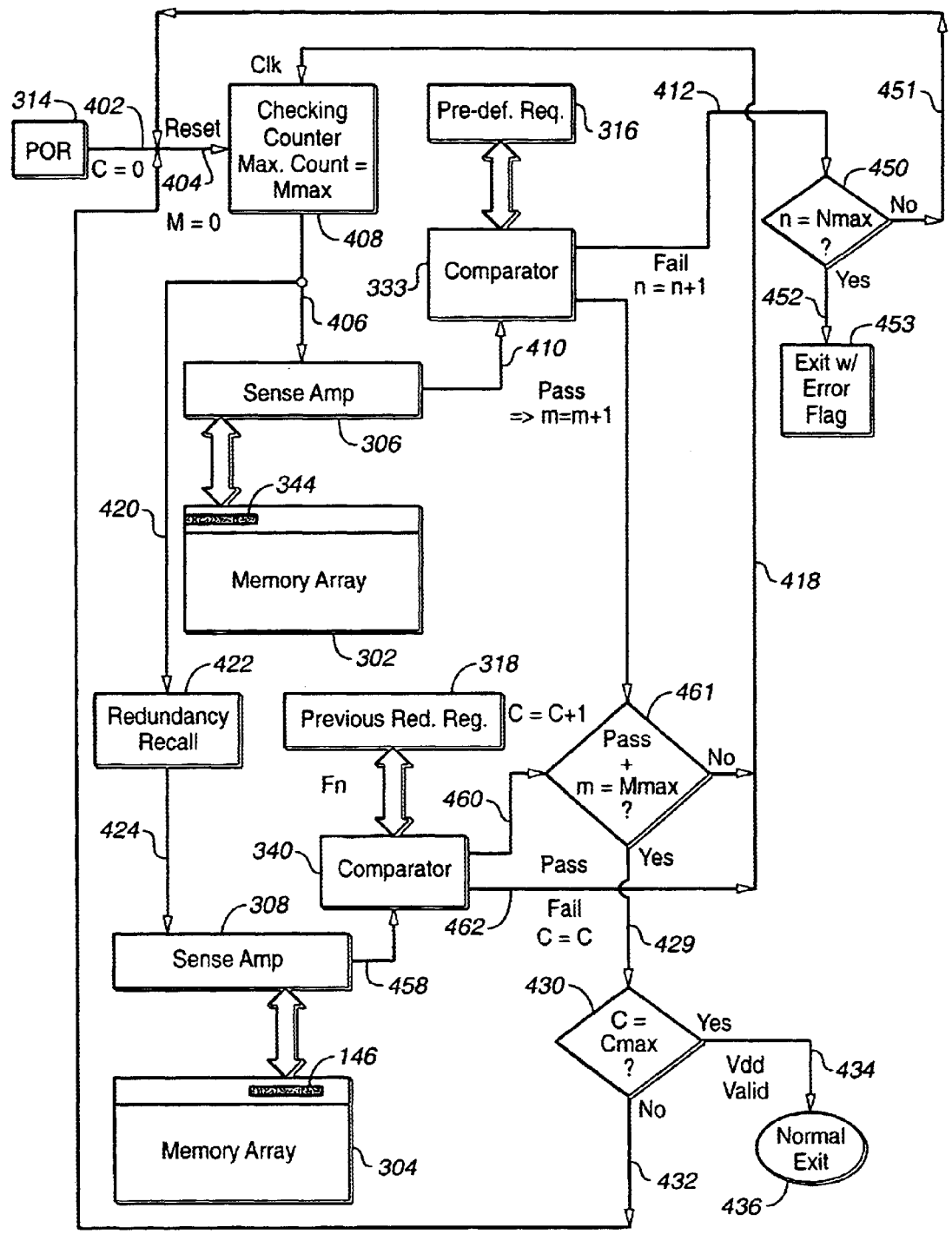
FIG._4

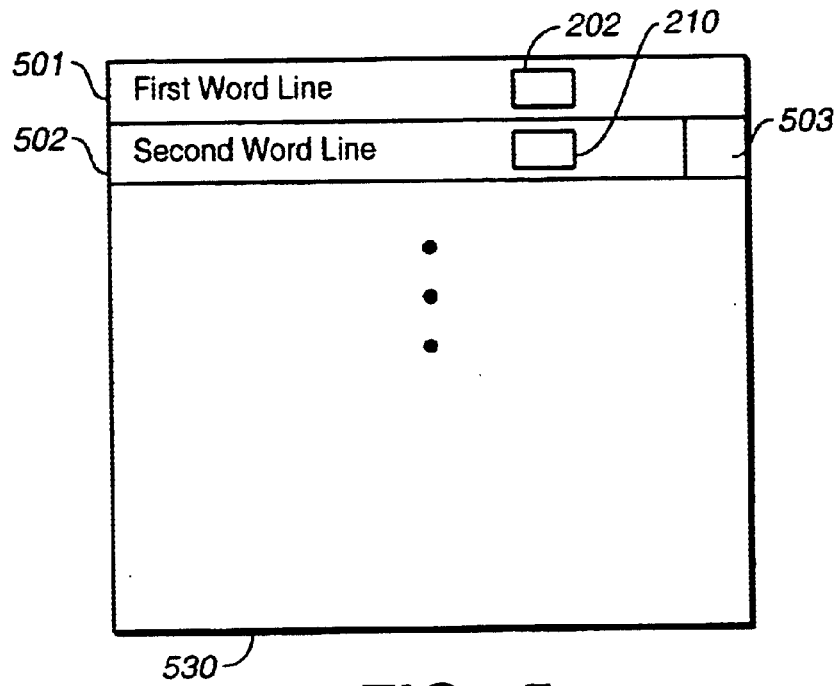
FIG._5
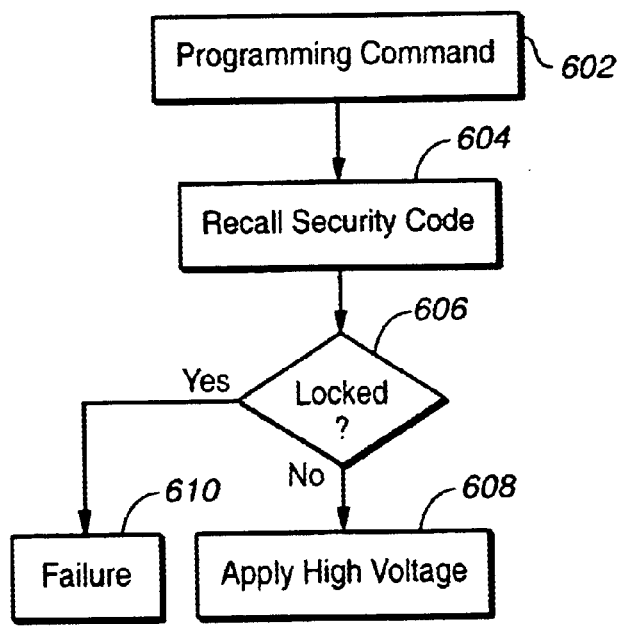
FIG._6

USER IDENTIFICATION FOR MULTI-PURPOSE FLASH MEMORY

BACKGROUND OF THE INVENTION

The present invention relates to a system and method for storing a serial identification, and more particularly, to a system and method for storing a serial identification in a non-volatile memory.

Conventional flash memory devices include storage locations in a memory that contain device and manufacturer information, such as part number and manufacturer name, and that cannot be changed by users of the device. During power up of the memory, the voltage level may not rise continuously, and thus the voltage applied to the memory may be in an unknown state. During the unknown state of the supply voltage, the memory may allow storage locations in the memory that are locked to be altered.

SUMMARY OF THE INVENTION

The present invention provides a memory that has storage locations that users of the memory, such as original equipment manufacturers, use to write user specified data into the storage location, and that may be locked by this user to prevent later writing or erasing.

The present invention provides a memory system that comprises a memory that includes a first storage area for storing a user selected identifier. A recall circuit reads the first storage area in response to a power-on reset signal. A high voltage generator generates a program voltage signal and an erase voltage signal to program or erase contents in selected portions of the memory in the event that the recall circuit reads the contents of the first storage area and determines a match to a predetermined value. The high voltage generator does not provide the program voltage signal or the erase voltage signal to the first storage area in the event that the recall circuit does not determine a match.

The present invention also provides a memory system that comprises a memory including a first storage area for storing a user selected identifier and a second storage area for storing a locking code. A recall circuit reads the second storage area in response to a power-on reset signal. A control circuit prohibits alteration of the contents in the first storage area in the event the locking code is in a first state and allows alteration of the contents in the first storage area in the event the locking code is in a second state. The second storage area may be unalterable in the event the locking code is in the first state.

BRIEF DESCRIPTION OF THE DRAWINGS

FIG. 1 is a block diagram illustrating a memory system in accordance with the present invention.

FIG. 2 is a block diagram illustrating the memory area of the memory system of FIG. 1.

FIG. 3 is a block diagram illustrating a memory system according to the present invention.

FIG. 4 is a signal control flow diagram illustrating a recall procedure according to the present invention.

FIG. 5 is a block diagram illustrating a memory area in another embodiment.

FIG. 6 is a flow chart illustrating the high voltage control of the memory of FIG. 1.

DETAILED DESCRIPTION

FIG. 1 is a block diagram illustrating a memory system 100 in accordance with the present invention. The memory system 100 comprises a memory array 102, an x-decoder 104, a y-decoder 106, an address interface 108, an input/output (I/O) interface 110, a high voltage generator 112, and a control circuit 114.

The memory array 102 comprises an array of memory cells (not shown) arranged in rows and columns and an array of redundant memory cells (not shown) arranged in rows and columns. The memory array 102 may be, for example, a static random access memory, a dynamic random access memory, or a flash memory. The flash memory may include, for example, non-volatile floating gate memory cells. See, for example, U.S. Pat. No. 5,289,411, which is incorporated herein by reference. Non-volatile floating gate memory cells, arranged in an array of a plurality of rows and columns are well known in the art. One example of a type of non-volatile floating gate memory cell is a source side injection memory cell. See, for example, the memory cell disclosed in U.S. Pat. No. 5,572,054 which is incorporated herein by reference.

The memory array 102 comprises a memory area 130 for storing identification information. In one embodiment, the memory area 130 is at predefined addresses of the memory array 102. The memory cells in the memory area 130 may be locked after being programmed to prevent later alteration.

The address interface 108 comprises buffers and latches for address signals 120 and provides decoded row and column addresses to the x-decoder 104 and the y-decoder 106.

The I/O interface 110 comprises buffers and data latches for communicating data with the memory array 102.

The high voltage generator 112 generates the high voltage signals for altering the contents of the memory cells of the memory array 102. The high voltage generator 112 provides a programming voltage signal to the memory array 102 to program selected memory cells, and provides an erase voltage signal to the memory array 102 to erase selected memory cells. The high voltage generator 112 receives control signals from the control circuit 114 for controlling the generation and application of the high voltage signals, the programming voltage signal and the erase voltage signal.

The control circuit 114 provides control signals to the x-decoder 104, the y-decoder 106, the address interface 108, the input/output (I/O) interface 110, and the high voltage generator 112 for controlling the memory system 100. The control circuit 114 controls alteration of the contents of the memory array 102 through writing and erasing of the memory and controls reading of the memory array 102. In one embodiment, the control circuit 114 receives command sequences in the address signal 120 from the address interface 108. In one embodiment, a three-byte sequence in the address signal 120 is used to program the memory array 102. In one embodiment, a six-byte sequence in the address signal 120 is used to erase the memory array 102. As an illustrative example, the operation of the memory system 100 is described using a three-byte sequence for programming and a six-byte sequence for erasing.

FIG. 2 is a block diagram illustrating the memory area 130 of the memory array 102.

The memory area 130 comprises a product identification (PI) 202, a device identification 206, an operation identification 208, and a customer identification (CID) 210.

The product identification 202 stores product information related to the device or manufacturer. In one embodiment, the product information may include the device part number (e.g., SST39LF/VF160) and the manufacturer (e.g., Silicon Storage Technologies, Inc.). Table I shows one example of the address and data of the product identification. The product identification 202 has been referred to as silicon identification.

TABLE I

|  | Address | Data |
| --- | --- | --- |
| Manufacturer's ID | 000H | 00BFH |
| Device ID SST39LF/VF160 | 001H | 2782H |

In one embodiment, the product identification 202 may be accessed by a three byte command of '90H'.

The device identification 206 stores an identifier programmed at the factory. In one embodiment, the device identification 206 is a read only location that is read only by a user. In one embodiment, the device identification 206 is a device serial number. In one embodiment, the device identification 206 may be a factory identification. In one embodiment, the device identification 206 may be accessed by a three byte command '88H'. In one embodiment, the device identification 206 is stored at an address in the range of '000000H' to '00000FH'.

The operation identification 208 stores identifiers that describe the memory system 100. In one embodiment, the identifiers may include command sets, addresses for tables, query strings, timing information, voltage requirements, and memory architecture information. In one embodiment, the operation information 208 may be the common flash memory interface (CFI). In one embodiment, the operation information 208 is accessed by a three bye command of '98H'.

The customer identification 210 stores an identifier programmed by the customer. In one embodiment, the customer identification 210 may be a program and lock location. In one embodiment, the customer identification 210 is at a memory location '000010H' to '00001FH'. The customer identification location 210 is programmed in a customer security identification program (CIDP) mode. For example, the 3-byte command entry may be 'A5H' to program at a specified customer identification location. The location may then be locked in a customer security identification lock (CIDL) mode. For example, the 3-byte command entry may be '85H' followed by predefined data, e.g., '0000H' at an address 'XXH'. In one embodiment, the CIDP mode is permanently disabled once the customer security identification lock mode is enabled.

In one embodiment, a command to exit reading or writing to the memory area 130 is a three byte command 'F0H'.

In one embodiment, the customer identification 210 includes an identifier location 212 and a locking code location 214. The identifier location 212 stores an identifier programmed by a user, such as an original equipment manufacturer (OEM). The identifier may also be information useable for an OEM equipment in which the memory system 100 is used. In one embodiment, the customer identification 210 may be information similar to the operation identification 208 at a system level. The locking code location 214 stores a locking code to disable writing to the identifier location 212 or write protect the identifier location 212. In one embodiment, the locking code location 214 is a one time write code that once written to disable writing to the location 212, the location 214 cannot be rewritten.

FIG. 3 is a block diagram illustrating a memory system 300 according to the present invention.

The memory system 300 as shown in FIG. 3 is a portion of the memory system 100 of FIG. 1.

The memory system 300 comprises a memory cell array 302, a redundant cell array 304, a sense amplifier array 306, a redundant sense amplifier array 308, an array decoder 310, a redundant array decoder 312, a power-on reset (POR) circuit 314, a pre-defined content register 316, a redundant cell content register 318, and a power validation circuit 320.

The power validation circuit 320 comprises a memory cell validation circuit 322 and a redundant cell validation circuit 324. The memory cell validation circuit 322 comprises a cell read pass counter 326, a cell read failure counter 328, a maximum cell read pass register 330, a maximum cell read failure register 332, and a plurality of comparators 333, 334, 335. The redundancy cell validation circuit 322 comprises a redundancy read counter 336, a maximum redundancy read register 338, and a plurality of comparators 340 and 341.

The memory cell array 302 and the redundant cell array 304 are part of the memory array 102. The array decoder 310 and the redundant array decoder 312 are part of the address interface 108, the x-decoder 104, and the y-decoder 106. The sense amplifier 306 and the redundant sense amplifier 308 are part of the y-decoder 106. The power-on reset circuit 314, the predefined content register 316, the redundant cell content register 318 and the power validation circuit 320 are part of the control circuit 114.

Address signals applied to the array decoder 310 and the redundant array decoder 312 are decoded for selecting memory cells in the memory cell array 302 or the redundant cell array 304, respectively. The sense amplifier array 306 and the redundant sense amplifier array 308 are coupled to the memory cell array 302 and the redundant cell array 304, respectively, for reading the contents of the selected memory cell. The power-on reset circuit 314 provides a power-on reset (POR) signal 342 to indicate that the power supply voltage applied to the memory 300 is higher than a certain voltage. In response to the power-on reset signal 342, the memory 300 initializes logic circuits therein before operation of the memory 300 begins. In another embodiment, an external circuit provides the power-on reset signal 342. In another embodiment, the power-on reset signal 342 is provided by applying a signal having a predetermined voltage, such as ground or Vdd, to a pin (not shown) of the memory 300. In another embodiment, an initiate signal is used for the memory validation.

The pre-defined content register 316 stores a pre-defined memory pattern Xn (e.g., AA55). The pre-defined memory pattern Xn is also stored in a predetermined location 344 in the memory cell array 302. The predetermined location 344 may be in the memory area 130 (FIG. 1). In one embodiment, the pre-defined content register 344 may store the product identification 202, the device identification 206, the operation identification 208, or the customer identification 210, or a combination of these identifications. In another embodiment, the memory 300 comprises a plurality of pre-defined content registers 316 for storing a plurality of pre-defined memory patterns. The comparator 333 compares the contents of the predetermined location 344 of the memory cell array 302 to the pre-defined memory pattern Xn stored in the pre-defined content register 316. The memory 300 may be initialized in an initialization procedure, such as by the manufacturer of the memory 300 or in a test mode. Such initialization procedure may store the pre-defined memory pattern Xn in the pre-defined content register 316 and in the predetermined location 344 of the memory cell array 302. In one embodiment, the pre-defined content register 316 is hardwired for storing the pattern Xn.

The redundant cell content register 318 stores data read from a predetermined location 346 of the redundant cell array 304. The data stored in the predetermined location 346 may be, for example, data Fn. In another embodiment, the memory 300 comprises a plurality of redundant cell content registers 318 for storing data read from a plurality of locations of the redundant cell array 304. The comparator 340 compares the contents of the predetermined location 346 of the redundant cell array 304 to the contents of the redundant cell content register 318. The initialization procedure may store the data in the predetermined location 346 of the redundant cell array 304.

The memory cell validation circuit 322 verifies the content of memory cells read during a power up sequence and processes memory validation routines. The cell read pass counter 326 counts a number (e.g., m) of times that a memory cell has passed a read verification. The maximum cell read pass register 330 stores a limit value (e.g., Mmax) for the number of read passes. The comparator 334 determines whether the read pass count equals the maximum cell read pass. The cell read failure counter 328 counts the number (e.g., n) of times that a memory cell fails a read verification. The maximum cell read failure register 332 stores a limit value (e.g., Nmax) for the number of read failures. The comparator 335 determines whether the read failure count equals the maximum cell failures.

The redundancy cell validation circuit 322 validates the read from the redundant cell array 304 and processes memory validation routines. The redundancy read counter 336 counts the number (e.g., c) of times that the redundancy cell array 304 has been read. The maximum redundancy read register 338 stores a limit value (e.g., Cmax) for the number of redundant cell reads. The comparator 341 determines whether the number of times the redundant cell array 304 has been read equals the limit value for the number of redundant cell reads.

Although the power validation circuit 320 is described as a circuit, the power validation circuit 320 may be implemented in software or a combination of hardware or software.

In another embodiment, another portion of the memory cell array 302 is used instead of a redundant cell array 304 for storing the pattern Fn.

The recall procedure may be, for example, to the verification procedures described in co-pending U.S. patent application Ser. No. 10/213,243, assigned to the same assignee as this patent application, filed Aug. 5, 2002, entitled "Embedded Recall Apparatus and Method in Non-volatile Memory", inventors Hung Q. Nguyen, San Thanh Nguyen, Loc B. Hoang, and Tam M. Nguyen, the subject matter of which is incorporated herein by reference.

FIG. 4 is a signal control flow diagram illustrating a recall procedure according to the present invention.

As noted above, data may be stored in the pre-defined content register 316, the predetermined location 344 of the memory cell array 302, and the predetermined location 146 of the memory cell array 304 via an initialization procedure. Also described above, the pre-defined content register 316 may store the product identification 202, the device identification 206, the operation identification 208, or the customer identification 210 or a combination of the identifications. For clarity, the recall procedure is described for the pre-defined content register 316 as a single memory location. However, the invention is not so limited and the recall may include multiple memory locations, such as the locations 202, 206, 208, and 210.

As an overview, after sensing a power on reset signal 342 from the power-on reset circuit 314, the predetermined location 344 is read and compared with contents of the pre-defined content register 316. Because of the unpredictability of the rise time and stability of the supply voltage, the memory is successively read a plurality of times. A number Mmax of successful consecutive reads and comparisons indicates a potentially good memory location and a valid supply voltage. A number Cmax of the successful consecutive Mmax reads are performed for a determination of a valid supply voltage. A predetermined location 346 of the redundant array 304 is read and a number Cmax of successful reads also are performed for a determination of a valid supply voltage. An unsuccessful read from the predetermined location zeros the count of the reads, and a maximum number Nmax of unsuccessful reads from the predetermined location 344 indicates a memory read failure or an invalid supply voltage.

At power on, the power-on reset circuit 314 applies the power-on reset signal 342 to the memory 300. The power-on reset signal 342 resets the redundancy read counter 336 to a count of zero (e.g., c=0) and resets the cell read failure counter 328 to a count of zero (e.g., n=0) (line 402), and resets the cell read pass counter 326 to a count of zero (e.g., m=0) (line 404). The memory cell validation circuit 322 commands a read from the predetermined location 344 of the memory cell array 302 (line 406) and a maximum count value is set in the maximum cell read pass register 330 (e.g., maximum count equals Mmax) (block 408). In another embodiment, the contents of the maximum cell read pass register 330 may be set in an initialization procedure at the manufacturer of the memory system 300 or in a test mode.

The sense amplifier 306 provides the read contents from the read predetermined location 344 to the comparator 333 (line 410). The comparator 333 compares the data read from the predetermined location 344 of the memory cell array 302 and the data stored in the predefined content register 316. In the event of a failure, the number of failures n in the cell read failure counter 328 is incremented by one (e.g., n=n+1) (line 412).

A determination is made if the number n of failures equals the maximum number Nmax of failures stored in the maximum cell read failure register 332 (block 450). In the event the number n does not equal the maximum Nmax of failures, the recall procedure resets the cell read pass counter 326 (e.g., set m=0) via the line 404 and rereads the location 344 as described for block 408 (line 451). In the event the number of failures n equals the maximum Nmax of failures (line 452), the recall procedure exits and sets an error flag (block 453).

On the other hand, in the event of a pass by the comparator 333, the cell read pass counter 326 is incremented by one (e.g., m=m+1) (line 414), and the comparator 334 determines whether the count m of the cell read pass counter 326 matches the maximum count value (e.g., m=Mmax) in the maximum cell read pass register 330 (block 461).

It is noted that block 461 may be reached two ways. The first is via the line 414. The second is by passing a redundancy recall via a line 460, which is described below. The analysis of block 461 is first described as though the redundancy recall has passed and is later described for the situation of entry from the redundancy recall. In the event that the cell read pass counter 326 is not equal to the maximum count value (e.g., m≠Mmax) (and the redundancy recall has passed), the comparator 334 provides a signal to command another read of the predetermined location 344 at block 408 (line 418).

On the other hand, in the event that the count m of the cell read pass counter 326 is equal to the maximum count value Mmax in the maximum cell read pass register 330 (block 461)(again this description is based as if the redundancy recall has passed), the recall procedure has completed Mmax successful consecutive reads of the location 344 (line 414). The recall procedure continues to a block 430 to analyze the numbers of times that the redundancy recall has passed, which is described below.

In parallel, the location 346 of the redundant array 304 may be tested.

The sense amplifier 306 also performs (line 420) a redundancy recall (block 422). The redundant cell validation circuit 324 commands a read from the predetermined location 346 of the redundant cell array 304 (line 424).

The redundant cell content register 318 stores the previously read contents read from the redundant cell array 304. The comparator 348 compares the currently read redundant register of the redundant cell array 304 (line 458) to the previously read redundant register stored in the redundant cell content register 318. The redundant sense amplifier array 308 also provides the read contents from the read predetermined location 346 to the redundant cell content register 318 (line 426).

In the event that the comparator 340 indicates a failure in the comparison of the currently read redundant register via line 458 and the previously read cell stored in the redundant cell content register 318, the number c of redundant cell reads remains the same (e.g., c=c) (line 462), and the memory location is again read (block 408) (line 418).

In the event that the comparator 340 indicates a pass in the comparison of the currently read redundant register via line 458 and the previously read cell stored in the redundant cell content register 318, the redundancy read counter 336 is incremented by one (e.g., c=c+1) (line 460) and proceeds to block 461.

In the event either the redundancy recall did not pass (e.g., test not completed) or that the cell read pass counter 326 is not equal to the maximum count value (e.g., M≠Mmax) (block 461), the comparator 334 provides a signal to command another read of the predetermined location at block 408 (line 418). In the event that both the redundancy recall passed and the cell read pass counter 326 is equal to the maximum count value (e.g., m=Mmax) (block 461), the count of the redundancy reads is analyzed via line 429 (block 430).

The comparator 341 compares the count c stored in the redundancy read counter 336 and the maximum count Cmax stored in the maximum redundancy read register 338, and determines whether the count c of the redundancy read counter 336 matches the maximum count value Cmax in the maximum redundancy read register 338 (e.g., c=Cmax) (block 430). In the event of no match, the comparator 341 provides a signal so that the cell read pass count m is reset (line 404) and the memory location is again read (block 408) (line 432). In an alternate embodiment, the reset of the cell read failure counter 328 to a count of zero (e.g., n=0) at line 402 may also be done on line 432. On the other hand, if the count c stored in the redundancy read counter 336 matches the maximum count value Cmax in the maximum redundancy read register 338 (e.g., c=Cmax), the supply voltage is determined to be valid (line 434), the recall procedure is completed, and the memory 300 is ready for normal operation (block 436).

In another embodiment, another failure count of reads from the redundant cell array 304 and a limit on the failure count may included in the recall procedure.

In another embodiment, the redundancy recall (elements 422, 424, 426, 421) may be done after the Mmax consecutive reads (block 416). In this embodiment, successful consecutive reads of the predetermined location 344 indicate that the power may be sufficiently high and stable to allow proper reading of the predetermined location 346.

In one embodiment, the recall time of the pattern Xn is much longer than the recall time of the pattern Fn in order to secure power turn on or a power glitch, which triggers the power on reset signal 342.

The recall procedure allows the predetermined location 344 and the memory area 130 to be read during power up. The high voltage generator 112 or the output thereof may be disabled until the recall procedure passes, as described below in conjunction with FIG. 6.

FIG. 5 is a block diagram illustrating a memory area 530 as another embodiment of the memory area 130.

The memory area 530 comprises a plurality of lines of data. For clarity, only a first line of data called a first word line 501 and a second line of data called a second word line 502 are shown. The first word line 501 and the second word line 502 may be in an information row portion of the memory area 530. The product identification 202 may be stored on the first word line 501. The customer identification 210 may be stored on the second word line 502.

In one embodiment, the first word line 501 may be erased and programmed for a read only mode by one user, such as the manufacturer. The user can only read the first word line 501, for example, by a three byte command.

In one embodiment, the customer identification 210 may be erased and programmed for read only. The locking code 214 is set, to cause the second word line 502 to be read only. In one embodiment, a three byte lock command programs one flag, such as a word or a byte or a bit, in the second word line 502.

Upon receiving 3-byte program-only mode, the second word line 502 is selected. The control circuit 114 commands a read of the second word line 502. If the locking code 214 is set to block writes, an access for programming is not allowed. If the locking code 214 is set to allow a write, the control circuit 114 commands the write and sets the locking code 214 to prohibit further writes. As noted above, the locking code or the flag data is not allowed to be accessed until a good recall is done at power up.

In one embodiment, the command may not include a command to rewrite the locking code 214 to a no write state. In this case, a pointer can remain pointed to the second word line 502 If the user does not lock the code 214 after programming before a power down, the second word line 501 may be accessed.

FIG. 6 is a flow chart illustrating the control of the high voltage generator 112.

In response to a programming command (block 602), the memory system 100 recalls the security bit stored in the customer identification location 210 using the recall procedure of FIG. 4 (block 604). The control circuit 114 determines whether the customer location 210 indicates that the location is locked (block 606). Until the supply voltage is determined to be valid, the control circuit 114 disables the high voltage generator 112 from erasing or programming the memory array 102. The recall security bit step of block 604 provides that the supply voltage is valid so that the determination of whether or not the customer identification 210 is locked and block 606 may be performed. If the customer identification 210 is locked, the memory indicates a failure (block 610). Otherwise if the customer identification 210 is not locked (block 606), the control circuit 114 enables the high voltage generator 112 to be able to apply high voltages to the memory array 102 for programming or erasing (block 608).

Although the memory 100 and 300 and the recall procedures have been described in terms of the normal read paths of the memory 100 and 300, similar circuits may be included for the reads and validation of the memory recall.

The memories 100 and 300 provide embedded circuits or software for performing memory recall at initiation, such as power-on or power reset, and validating that initiation is complete by reading the memory and verifying the contents are properly read for successive reads.

Although a memory is described as a stand-alone system, the memory may be included as an embedded memory in other systems, such as a central processing unit or a computer system, or may be included in systems using memory devices.

In this disclosure, there is shown and described only the preferred embodiments of the invention, but it is to be understood that the invention is capable of use in various other combinations and environments and is capable of changes or modifications within the scope of the inventive concept as expressed herein.

What is claimed is:

1. A memory system comprising:
   a memory including a first storage area for storing a user selected identifier and a second storage area for storing a locking code;
   a recall circuit for reading said second storage area in response to a power-on reset signal;
   a control circuit for prohibiting alteration of the contents in the first storage area in the event the locking code is in a first state and for allowing alteration of the contents in the first storage area in the event the locking code is in a second state.

2. The memory system of claim 1 wherein the second storage area is unalterable in the event the locking code is in said first state.

3. The memory system of claim 1 further comprising a high voltage generator for generating a program voltage signal and an erase voltage signal to program or erase contents in selected portions of the memory, the high voltage generator not providing said program voltage signal or said erase voltage signal to said first storage area in the event the control circuit prohibits alteration of the contents in the first storage area.

4. The memory system of claim 1 wherein the first and second storage areas are on the same word line.

5. The memory system of claim 4 wherein the control circuit includes a pointer to the second word line that points to the second word line and the locking code is not set to prevent writing.

6. A memory system comprising:
   a memory including a first storage area for storing a user selected identifier;
   a recall circuit for reading said first storage area in response to a power-on reset signal;
   a high voltage generator for generating a program voltage signal and an erase voltage signal to program or erase contents in selected portions of the memory, the high voltage generator not providing said program voltage signal or said erase voltage signal to said first storage area in the event the recall circuit does not read the first storage area and providing said program voltage signal and said erase voltage signal to said first storage area in the event that the recall circuit reads the first storage area.

7. A method for storing data in a memory, the method comprising:
   storing a user selected identifier in a first storage area;
   storing a locking code in a second storage area of the memory;
   reading said second storage area in response to a power-on reset signal;
   prohibiting alteration of the contents in the first storage area in the event the locking code is in a first state and allowing alteration of the contents in the first storage area in the event the locking code is in a second state.

8. The method of claim 7 wherein the second storage area is unalterable in the event the locking code is in said first state.

9. The method of claim 7 further comprising:
   generating a program voltage signal and an erase voltage signal to program or erase contents in selected portions of the memory in the event the locking code is in said second state; and
   prohibiting application of the program voltage signal and the erase voltage signal to the memory in the event the locking code is in the first state.

10. A method comprising:
    reading a first storage area in a memory cell to validate whether a user selected identifier is stored in said first storage area after receipt of a power-on reset signal;
    generating a high voltage signal to alter the contents in selected portions of the memory in the event the read user selected identifier is not read from the first storage area.

11. A memory system comprising:
    a memory including a first storage area for storing a user selected identifier and a second storage area for storing a locking code;
    an input interface for receiving a command signal;
    a control circuit generating a first write signal to control a write to the first storage area to store the user selected identifier in response to the command signal being a program command and the locking code being in a first state, generating a read signal to control a read of the first storage area in response to the command signal being a read command, and generating a second write signal to control a write to the first storage area to store the user selected identifier and to control a write to the second storage area of a locking code in a second state in the response to the command signal being a program and lock command and the locking code stored in the second storage area being in the first state.

12. The memory system of claim 11 further comprising a high voltage generator for generating a program voltage signal and an erase voltage signal to program or erase contents in selected portions of the memory, the high voltage generator not providing program voltage signal or said erase voltage signal to said first storage area in the event the control circuit prohibits alteration of the contents in the first storage area.

13. A method comprising:
    receiving a command signal;
    generating a first write signal to control a write to a first storage area of a memory to store a user selected identifier in response to the command signal being a program command and a locking code stored in a second storage area of the memory being in a first state;
    generating a read signal to control a read of the first storage area in response to the command signal being a read command, and
    generating a second write signal to control a write to the first storage area to store the user selected identifier and to control a write to the second storage area of a locking code in a second state in the response to the command signal being a program and lock command and the locking code stored in the second storage area being in the first state.

14. The method of claim 13 further comprising:

generating a program voltage signal and an erase voltage signal to program or erase contents in selected portions of the memory; and blocking the application of the program voltage signal and the erase voltage signal to said first storage area in the event the locking code stored in the second storage area is in the second state.

* * * * *